(12) United States Patent
Cardinale et al.

(10) Patent No.: US 7,128,559 B1
(45) Date of Patent: Oct. 31, 2006

(54) PROGRAMMABLE IMPRINT LITHOGRAPHY TEMPLATE

(75) Inventors: Gregory F. Cardinale, Oakland, CA (US); Albert A. Talin, Livermore, CA (US)

(73) Assignee: Sandia National Laboratories, Livermore, CA (US)

( * ) Notice: Subject to any disclaimer, the term of this patent is extended or adjusted under 35 U.S.C. 154(b) by 429 days.

(21) Appl. No.: 10/756,978

(22) Filed: Jan. 13, 2004

(51) Int. Cl.
  *B29C 59/02* (2006.01)
(52) U.S. Cl. .......................... 425/385; 216/52; 425/406
(58) Field of Classification Search ................ 425/385, 425/406, 577; 977/887; 216/44, 52
  See application file for complete search history.

(56) References Cited

U.S. PATENT DOCUMENTS

| | | | |
|---|---|---|---|
| 4,687,434 A * | 8/1987 | Beglinger ................... 425/556 |
| 5,772,905 A * | 6/1998 | Chou .......................... 216/44 |
| 5,993,189 A * | 11/1999 | Mueller et al. .......... 425/405.1 |
| 6,280,661 B1 * | 8/2001 | Takakuwa et al. ......... 264/1.33 |
| 6,416,311 B1 * | 7/2002 | Springer et al. ............ 425/385 |
| 6,656,398 B1 * | 12/2003 | Birch et al. .................... 264/85 |

* cited by examiner

*Primary Examiner*—Joseph S. Del Sole
*Assistant Examiner*—Emmanuel S. Luk
(74) *Attorney, Agent, or Firm*—Donald A. Nissen

(57) ABSTRACT

A template for imprint lithography (IL) that reduces significantly template production costs by allowing the same template to be re-used for several technology generations. The template is composed of an array of spaced-apart moveable and individually addressable rods or plungers. Thus, the template can be configured to provide a desired pattern by programming the array of plungers such that certain of the plungers are in an "up" or actuated configuration. This arrangement of "up" and "down" plungers forms a pattern composed of protruding and recessed features which can then be impressed onto a polymer film coated substrate by applying a pressure to the template impressing the programmed configuration into the polymer film. The pattern impressed into the polymer film will be reproduced on the substrate by subsequent processing.

9 Claims, 6 Drawing Sheets

PROGRAMMABLE IMPRINT LITHOGRAPHY TEMPLATE

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATIONS

Not applicable.

FIELD OF THE INVENTION

The invention pertains to a device for creating patterns with ultrafine features by imprint lithography. More specifically, a programmable lithographic template, wherein the template pattern is configured by means of an array of moveable and individually addressable plungers.

BACKGROUND OF THE INVENTION

In conventional optical lithographic practice a thin film of a photoresist material is applied to a substrate. The photoresist film is exposed to a desired pattern of radiation and the exposed photoresist is developed to reproduce the desired pattern. The pattern can be reproduced onto the surface of the substrate by an etching process. However, in this approach resolution is limited by the wavelength of the exposure radiation and as the feature size becomes smaller the equipment becomes increasingly expensive and complex.

Imprint lithography (IL) has gained considerable attention as a cost effective and technically feasible method for fabricating nanometer-dimension structures. Due to its low cost relative to conventional optical lithography tools and next generation lithographies (NGL), and because of the apparent ability to produce devices with critical dimensions as small as 10 nm, IL can play an important role in the integrated circuit and hard disk drive industries as well as telecommunications, specifically in the production of surface acoustic wave devices.

For imprint lithography techniques generally, a relief pattern in a template is used, in conjunction with polymeric materials to create a desired pattern on a substrate. The process, illustrated generally in FIGS. 1a–1d, involves coating the surface of a substrate 110, that can be silicon or quartz, with a thin film of a deformable polymer material 115 (FIG. 1a). Subsequently, the film is imprinted with a pattern of trenches by applying pressure to a patterned template 120 (FIG. 1b). Application of pressure can be mechanical or by fluid pressure such as disclosed in U.S. Pat. No. 6,482,742 to Chou. The imprinted film can be cured by the application of heat, illumination, pressure or combinations thereof. Following the curing step (FIG. 1c), a reactive ion etch (RIE) process can be used to remove unwanted material from the trenches imprinted on the surface of the polymer film and transfer the pattern into an under lying structure that can be the substrate or other functional thin films (FIG. 1d) (cf. Voisin, U.S. Patent Application Publication US 2003/0205657, Nov. 6, 2003). The imprint lithography process is discussed in detail in U.S. Pat. No. 5,772,905 to Chou.

For integrated circuit manufacturing or other high resolution applications, the template should have a precise pattern that pressing transfers, inherently with minimal demagnification, to the surface of the integrated circuit device.

Numerous variations of the basic IL method outlined above have been developed. Discussions of these methods can be found in Bailey et al., J. Vac. Sci. Tech. B 18(6), 3572–3577 (2000), Colburn et al., Proc. SPIE, 3676, 379–389 (1999), Tan et al., J. Vac. Sci. Tech., B16(6), 3926–3928, (1998), and Sreenivasan et al., Proc SPIE, 4688, 903–909 (2002).

One particular IL component critical to its cost effectiveness is the template or mask. According to a cost-of-ownership study by Sreenivisan (ibid.), the IL mask is estimated to cost about $40,000. This mask cost assumes volume production and an inspection and repair infrastructure that is not currently available. Actual mask cost in prototyping volumes will likely approach $100,000, particularly since the mask is a "1×" technology. That is, the feature sizes that are printed are equal to their corresponding features on the mask. This is in contrast to the reduction technology practiced in most commercial optical photolithography technologies that typically employ 4× or 5× reduction. As with all masks, as the feature size of IL masks decreases, the time required to pattern or "write" a mask increases. Consequently, not only does the mask cost increase but also the turnaround time to fabricate a mask increases. Thus, for small-volume manufacturing and prototyping, mask costs can become prohibitively expensive, i.e., the mask amortization cost schedule far exceeds the technology generation duration.

SUMMARY OF THE INVENTION

Accordingly, the present invention is directed to a method for imprint lithography (IL) that uses masks or templates that are reconfigurable and programmable, thereby reducing significantly template production costs by allowing the same template to be re-used for several technology generations.

As illustrated in FIG. 2 generally, an IL template, according to the invention, comprises an array of moveable, individually addressable, and spaced-apart rods or plungers (FIG. 2a). The template or mask can be configured to provide a particular pattern by programming the array of plungers such that certain of the plungers are in an "up" or actuated configuration (FIG. 2b). The pattern of the "up" plungers can then be impressed onto a polymer film by conventional IL methods such as described above. Conversely, an impressible pattern can also be configured by moving certain of the plungers into a "down" position; the remaining "up" plungers then form the desired pattern. This mode of patterning the template is illustrated in FIG. 2, wherein certain plungers have been moved into the "down" position to produce an "L" when stamped into a deformable material such as a photoresist. Individual plungers can be displaced by actuation methods known to the microelectromechanical (MEMS) art. These include, but are not limited to: thermal, electrostatic, pressure (by bubble formation), microfludic, or magnetic actuation methods.

Once a pattern's usefulness has been exhausted, i.e., the pattern is now technologically obsolete, the template can be reprogrammed by rearranging the distribution of "up" and "down" rods to form a new pattern.

In one embodiment of the invention a imprint lithography template, comprises:
 a two-dimensional array of plungers arranged on a surface, wherein the plungers are each individually addressable and actuated to move in a vertical direction; and actuating means.

BRIEF DESCRIPTION OF THE DRAWINGS

The accompanying drawings, which are incorporated in and form part of the specification, illustrate the present invention and, together with the description, explain the invention. In the drawings, like elements with like functions are referred to by like numbers.

DETAILED DESCRIPTION OF THE INVENTION

The plunger configuration of the invention can be produced by methods known to the semiconductor art. A method of making a plunger configuration will be described generally by reference to FIGS. 3a–3e, FIGS. 4a–4d and FIGS. 5a and 5b. These figures illustrate a method of producing a single plunger configuration. In order to form the imprint template of the invention this process can be repeated to form an array either a plurality of times or in a single step.

Figure 3A:
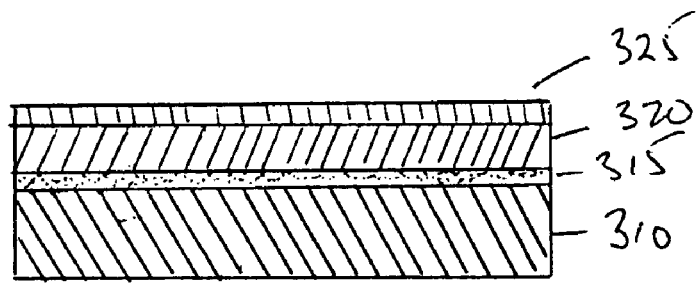
FIGS. 3a–3e illustrate a process for making a plunger wafer.
Figure 3B:
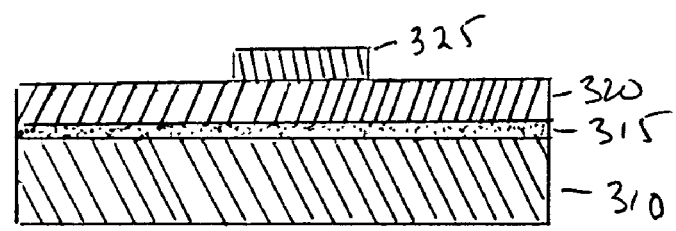
Figure 3C:
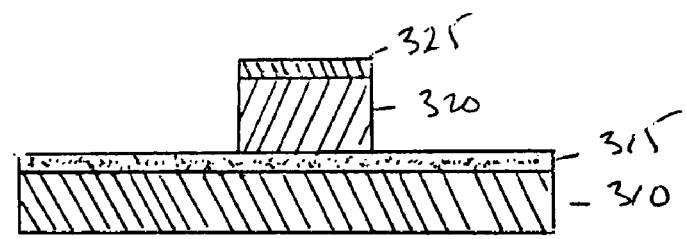
Figure 3D:
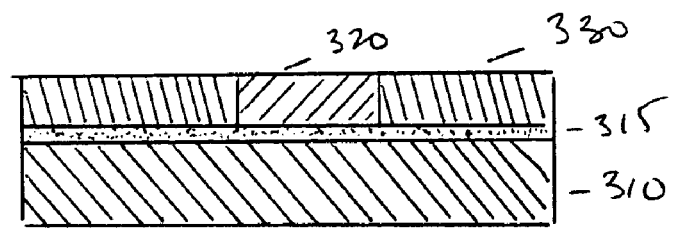
Figure 3E:
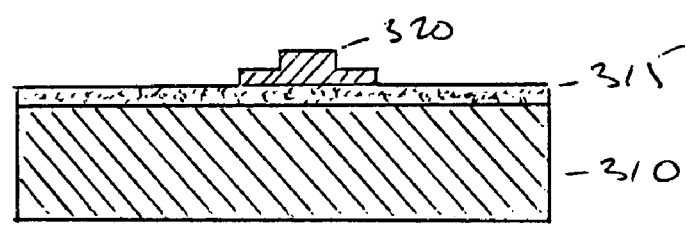

As a first step, a plunger wafer is prepared. As shown in FIG. 3a, the plunger wafer comprises a substrate 310 coated with an oxide layer 315, a device wafer 320 and finally a photoresist layer 325. Art recognized steps such as patterning (FIG. 3b), etching and stripping the photoresist (FIG. 3c), depositing a planarization and second photoresist layer 330 (FIG. 3d), and finally again patterning, etching and stripping both the photoresist and planarization layers are used to form the final plunger structure 320 (FIG. 3e).

Figure 4A:
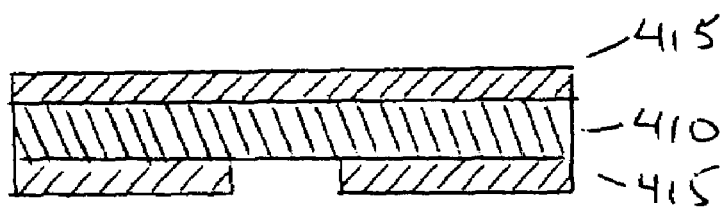
FIGS. 4a–4d illustrate a process for making a capping wafer.
Figure 4B:
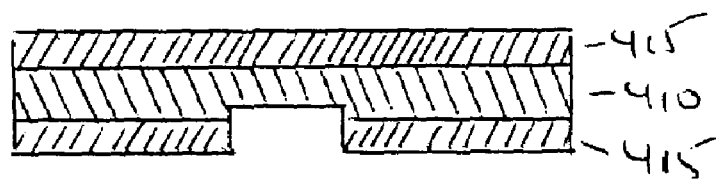
Figure 4C:
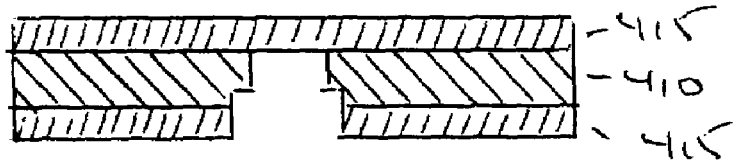
Figure 4D:

As a second step in making a plunger configuration, a capping wafer is prepared. Referring now to FIG. 4, a capping wafer 410 is coated on both the upper and lower surfaces with a photoresist material 415. The photoresist covering lower surface is patterned (FIG. 4a) followed by a shallow pattern transfer (etch) (FIG. 4b). A second mask is deposited on the lower surface and a deep pattern etch transfer etch is done to form a stepped structure such as that illustrated in FIG. 4c. Finally, the second mask is stripped from the lower surface as well as the photoresist layer covering the upper surface.

Figure 5A:
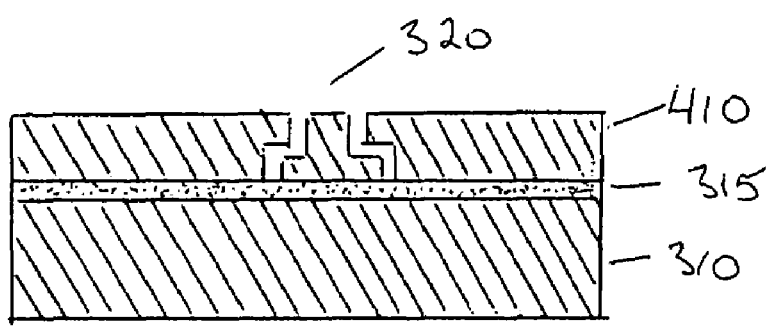
FIGS. 5a and 5b illustrate a process for joining the capping and plunger wafers.
Figure 5B:
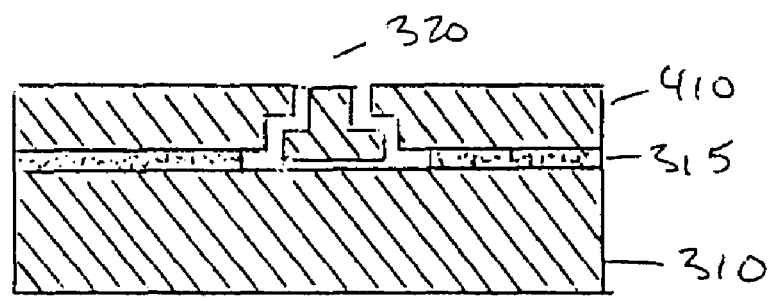

As a final step, patterned capping wafer 410 is bonded (e.g., anodically) to rod wafer 310 (FIG. 5a) and oxide layer 315 beneath plunger 320 is etched away, thereby freeing the plunger from the rod wafer (FIG. 5b).

The pattern dimension determines the tip or cross-sectional dimension of the plunger. Typical cylindrical plunger dimensions are length 1–10 μm, diameter (widest part) 0.2–0.5 μm, and diameter (narrowest part) 0.15–0.4 μm. However, in some applications it can be necessary for the plunger to pattern sub-100 nm features. In those instances the plungers can be made from silicon oriented along the (100) plane and wet etching the ends using potassium hydroxide (KOH) to form tetrahedral shaped stamping faces. While silicon is the preferred material for fabricating the plungers, they can be made from other metals, polymers, and ceramic materials.

The plungers are preferably spaced about 0.5 to 2 μm apart, center-to-center, depending on the plunger dimensions. To overcome packing density limitations, i.e., when patterning nm-scale patterns, it is contemplated to step the template to form a complete pattern one pixel at a time.

While the invention has been illustrated with cylindrical rods or plungers, the plungers can be fabricated in a variety of ways to form other geometric shapes such as, but not limited to square or tetrahedral in cross-section, or conical. The shape of the rod can be determined by the application.

Figure 1A:
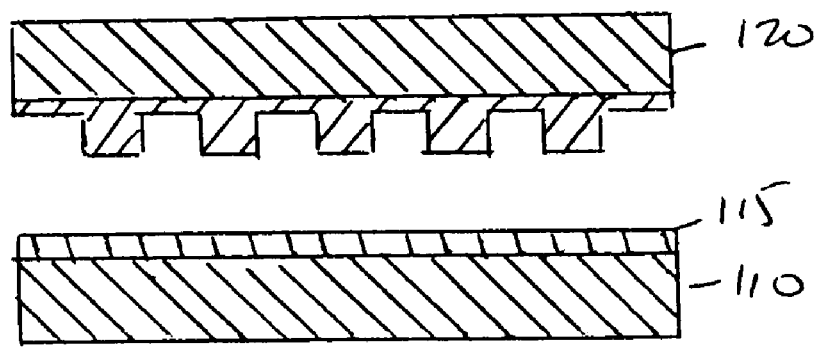
FIGS. 1a–1d illustrate generally imprint lithography.
Figure 1B:
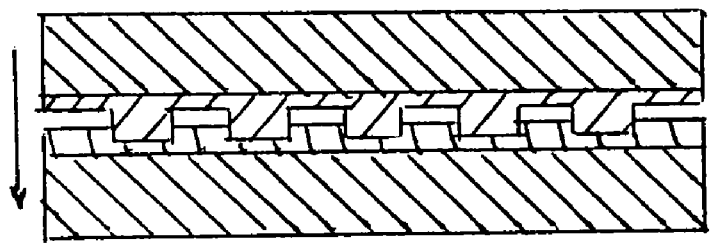
Figure 1C:
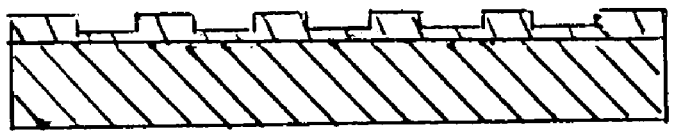
Figure 1D:
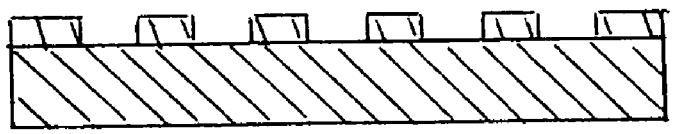
Figure 2A:
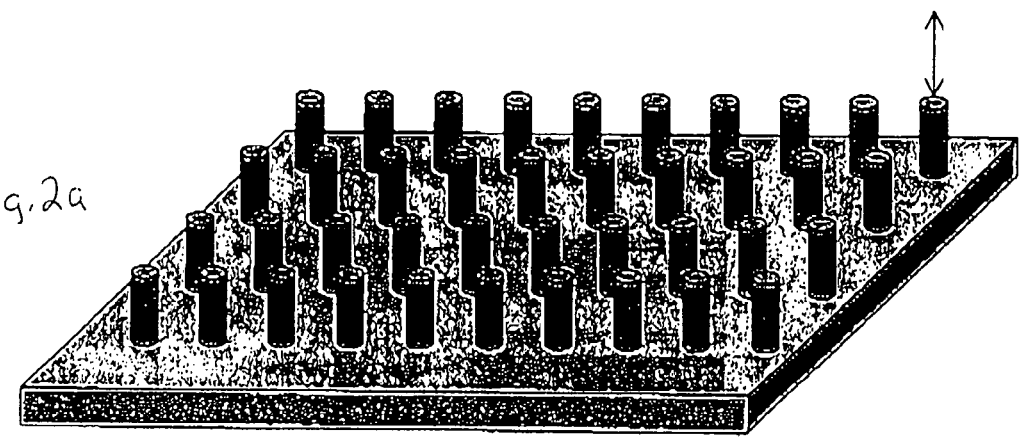
FIG. 2 shows mask according to the invention in the unactuated (2a) and actuated (2b) positions.
Figure 2B:
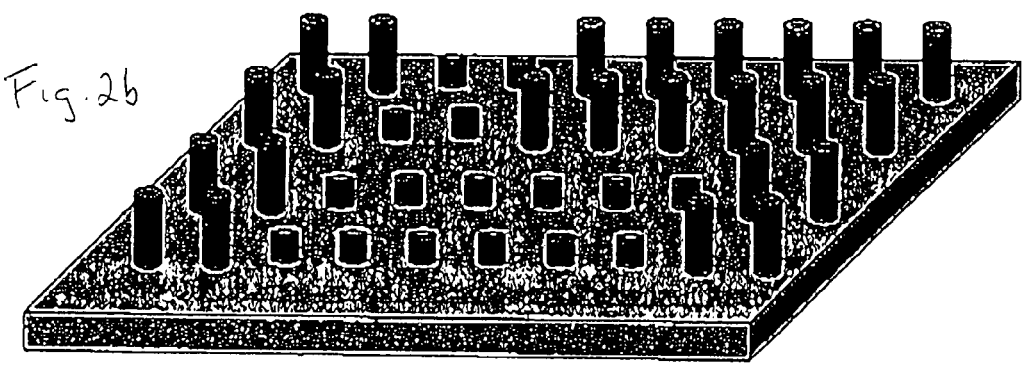
Figure 6G:
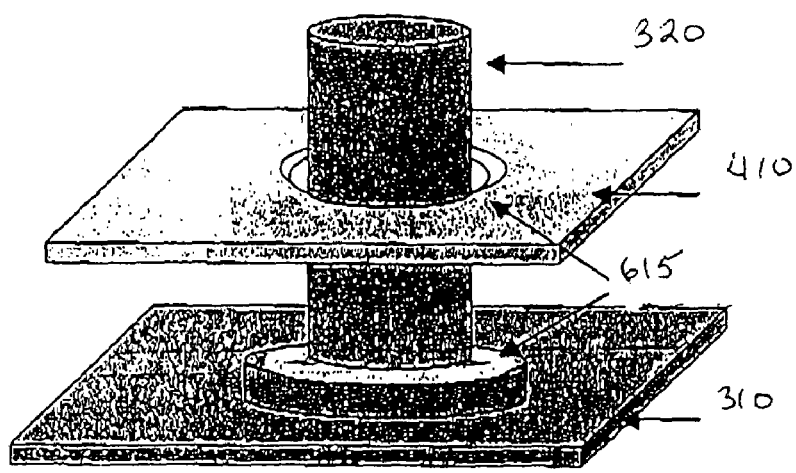
FIGS. 6a and 6b illustrate an electrostatic method for actuating a plunger.
Figure 6G:
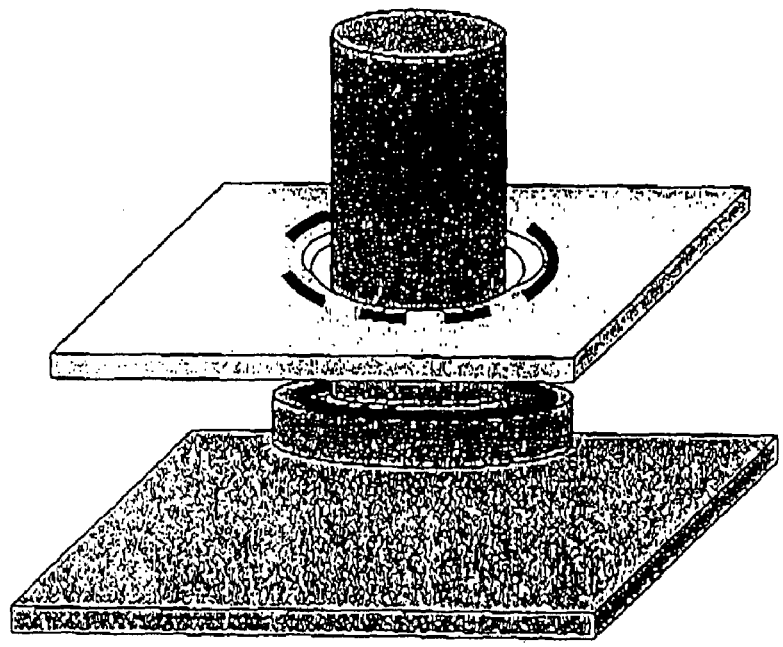

As discussed above, the mask or template can be configured to provide a particular pattern by programming the array of rods or plungers such that certain of the rods are in an "up" or actuated configuration. The pattern of the "up" plungers can then be impressed on the polymer film by any of the methods known in the art. Referring now to FIGS. 6a and 6b, which illustrate an electrostatic method of actuating a plunger. Individual plungers such as 320 are addressed using feed-through interconnects, wherein a wafer is processed in such a manner that through-holes are etched at each plunger location. These holes are subsequently filled with an electrically conducting material such as doped polysilicon to form electrodes 615. Electrical connection is made to external control circuitry by trace lines patterned on the wafer and wire bonding. Applying an electric signal to the electrodes causes plunger 320 to rise from its "down" or non-actuated state (FIG. 6a) to its actuated or "up" state (FIG. 6b). While an electrostatic method for raising a plunger has been illustrated for only one plunger, in actuality a similar process would take place for a plurality of plungers in order to form a pattern such as that illustrated in FIG. 2.

Other means of actuating the array of plungers to produce a desired configuration will be obvious to those skilled in the microelectromechanical (MEMS) art. These include, but are not limited to thermal, pressure (by bubble formation), microfludic, or magnetic actuation methods.

In operation, a substrate, typically a silicon wafer is coated with a polymer film, such as PMMA, that can be readily deformed. A template is configured to a particular pattern by providing an actuating signal to the array of plungers such that certain of the plungers are in an "up" or actuated configuration. Conversely, certain of the plungers can be actuated into a "down" position to form the pattern, as discussed above. This arrangement of "up" and "down" plungers forms a pattern composed of protruding and recessed features which can then be impressed on the polymer film by applying a pressure to the template sufficient to deform the film, thereby impressing the programmed configuration into the polymer film. The pressure used should be sufficient to impress the template pattern into the polymer film but not so large as to cause the template pattern to break through the polymer film and contact the underlying substrate. During the step of impressing heat, light and/or pressure can be applied to retain the impressed pattern. When the template is withdrawn the recesses produced wherever an "up" plunger contacts the polymer can be etched away to expose the underlying substrate which can now be further processed to produce the desired pattern.

By virtue of the ability to reprogram the template to form a new pattern, it can be used to produce multilayer devices, wherein each layer comprises a different pattern. After the template has been withdrawn it can be reconfigured, as described above. Subsequent to the etching process a new polymer film can be applied to the substrate, the new pattern impressed therein and the process repeated.

We claim:

1. A template for imprint lithography comprising a two-dimensional array of spaced-apart plungers arranged on a surface, wherein the plungers are each individually addressable and actuated to move in a vertical direction and wherein the plungers comprise a plunger and capping wafer; and actuating means.

2. The template of claim 1, wherein the plungers are circular in cross-section.

3. The template of claim 1, wherein the plungers are made from silicon.

4. The template of claim 3, wherein the plungers are fabricated from silicon oriented along the (100) plane.

5. The template of claim 1, wherein said actuating means include electrostatic, thermal, pressure, microfludic, or magnetic actuation.

6. The template of claim 1, wherein the plungers are spaced from about 0.5 to about 2 μm apart.

7. A method for forming a lithographic pattern, comprising:
   providing a substrate having a deformable polymer film deposited thereon;
   actuating the plungers of the template of claim 1 to provide a pattern of protruding and recessed features;
   urging the patterned template at a molding pressure into the polymer film, thereby transferring the template pattern onto the polymer film;
   freeing the template from the film;
   processing the patterned polymer film to remove the thin portions of the film; and
   etching the substrate to reproduce the template pattern.

8. The method of claim 7, further including the step of stepping the template over the surface of the polymer film.

9. A method for forming a multilayer device, comprising the steps of:
   preparing a lithographic pattern by the method of claim 7;
   reconfiguring the template to form a new pattern of protruding and recessed features; and
   repeating the steps of urging, freeing, processing and etching to form a multilayer device.

* * * * *